(12) United States Patent
Sun et al.

(10) Patent No.: US 6,242,367 B1
(45) Date of Patent: Jun. 5, 2001

(54) METHOD OF FORMING SILICON NITRIDE FILMS

(75) Inventors: Sey-Ping Sun, Austin, TX (US); Minh Van Ngo, Fremont, CA (US)

(73) Assignee: Advanced Micro Devices, Inc., Austin, TX (US)

( * ) Notice: Subject to any disclaimer, the term of this patent is extended or adjusted under 35 U.S.C. 154(b) by 0 days.

(21) Appl. No.: 09/352,520

(22) Filed: Jul. 13, 1999

(51) Int. Cl.$^7$ ................................................. H01L 21/469
(52) U.S. Cl. ............................................. 438/792; 437/787
(58) Field of Search ...................... 438/425, 427, 438/437, 786, 791, 792, 693, 697

(56) References Cited

U.S. PATENT DOCUMENTS 5,714,408 * 2/1998 Ichikawa ............................... 438/241

* cited by examiner

*Primary Examiner*—David Nelms
*Assistant Examiner*—Dung A Le
(74) *Attorney, Agent, or Firm*—Williams, Morgan & Amerson, P.C.

(57) ABSTRACT

The present invention is directed to a method of forming process layers comprised of silicon nitride. In one embodiment, the method comprises forming a silicon nitride layer using silane volumes ranging from approximately 350–390 standard cubic centimeters.

49 Claims, 2 Drawing Sheets

METHOD OF FORMING SILICON NITRIDE FILMS

BACKGROUND OF THE INVENTION

1. Field of the Invention

The present invention is generally directed to the field of semiconductor processing, and, more particularly, to an improved method for making process films comprised of silicon nitride.

2. Description of the Related Art

In the manufacture of semiconductor devices, process films comprised of silicon nitride are formed at various points during the manufacturing process. By way of example, nitride films are formed in connection with the formation of nitride spacers positioned adjacent the gate conductor of a transistor. One illustrative technique for forming such spacers is depicted in FIGS. 1 and 2 of the attached drawings.

As shown in FIG. 1, a gate stack 12 comprised of a gate conductor 16 and a gate dielectric 14 are formed above a surface 11 of a semiconducting substrate 10. The gate dielectric 14 and the gate conductor 16 are typically made by forming process layers comprised of the appropriate materials above the surface 11 of the substrate 10, and patterning those layers by performing one or more etching processes to define the gate stack 12. Thereafter, the substrate 10 is subjected to a low energy ion implantation process to form lightly doped regions 20 in the substrate 10. Next, a layer 18 of silicon nitride is typically formed above the surface 11 of the substrate 10 and above the gate stack 12 by one or more processes, such as a plasma enhanced chemical vapor deposition ("PECVD") process. Thereafter, the device is subjected to one or more anisotropic etching processes to define sidewall spacers 22 comprised of silicon nitride, as shown in FIG. 2. An additional ion implantation process is then performed to complete the formation of the source/drain regions 24 having the familiar lightly doped drain ("LDD") structure. The fabrication of the transistor is completed by forming appropriate metal contacts through various openings in the layers of dielectric material positioned above the device.

Although there are existing techniques for forming the layer 18 comprised of silicon nitride, the layers resulting from such known techniques or processes exhibit many problems that are detrimental to device performance and integrity. As is well known to those skilled in the art, given the continuing drive to reduce the size of the transistors and increase the operating speed of the transistors, it is imperative that all aspects of the semiconductor device, including the formation of the nitride spacers 22, must be optimized to produce integrated circuit devices of the speed and integrity required by modern electronic devices.

Once problem associated with using known techniques for forming silicon nitride layers is that such techniques produce unacceptable variations in the thickness of the deposited layer. For example, using known processes, a deposited layer of silicon nitride may vary in thickness by as much as ±5%, e.g., a silicon nitride layer of a nominal thickness of 1000 Å may vary by ±50 Å. Such variations in the thickness of the nitride layers formed using known techniques and processes may lead to unacceptable results and decreased transistor performance. For example, if the width of the silicon nitride spacer 22 is 5% wider than anticipated by the transistor designers, adverse impacts on the operating performance of the transistor may occur, i.e., the location of the dopant added during the second implant step may be varied so as to reduce transistor performance below acceptable limits.

Another problem associated with known processes and techniques for forming silicon nitride layers is that the step coverage of the nitride layer as it is formed over a structure, or step, is less than desired. By way of background, step coverage is an expression of the minimum thickness of a process layer as it passes over a step, e.g., a gate stack, as compared to the nominal thickness of the deposited layer on a horizontal surface, expressed as a percentage. Ideally, the thickness of the deposited layer of nitride is uniform as it is formed over such a step. However, as a practical matter, there is ordinarily some thinning of the process layer as it is formed over various steps on the topography of the semiconductor device. Poor step coverage can lead to many problems, among which is a lack of thickness control and nonuniformity of not only the layer under consideration, but layers formed subsequent to the formation of the nitride layer.

Another problem encountered with nitride layers that have been formed using prior art processes is that there may be problems in measuring the thickness of the nitride layer formed over a preexisting layer of silicon dioxide. Part of the problem is due to the relatively low density of the silicon nitride layer formed using known techniques and processes. For example, problems are sometimes encountered using a metrology tool known as an Optiprobe due, in part, to the lower density of silicon nitride layers formed using known processes and techniques.

Yet another problem encountered with the formation of nitride layers using existing PECVD processes is the relatively large amount of power used to form such nitride films. In general, the higher power usage during the formation of such nitride layers may lead to problems such as shifting of the threshold voltage of the resulting semiconductor device.

Therefore, it is desirable to have a method that reduces the amount of power used to form such nitride films in modern semiconductor devices.

The present invention is directed to solving, or at least reducing, some or all of the aforementioned problems.

SUMMARY OF THE INVENTION

The present invention is directed to forming a process layer comprised of silicon nitride. The method comprises positioning a wafer in a chamber of a production tool, introducing approximately 350–390 standard cubic centimeters (sccm) of silane ($SiH_4$) into said chamber, and generating a plasma in said chamber.

BRIEF DESCRIPTION OF THE DRAWINGS

The invention may be understood by reference to the following description taken in conjunction with the accompanying drawings, in which like reference numerals identify like elements, and in which.

Figure 1:
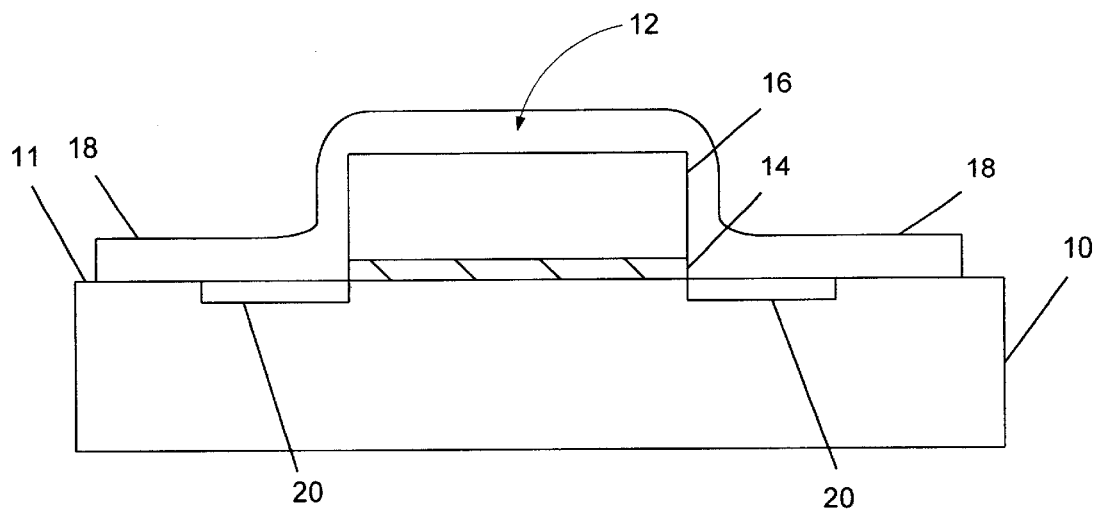
FIG. 1 is an illustrative embodiment of a partially formed semiconductor device showing a silicon nitride film formed thereabove.

While the invention is susceptible to various modifications and alternative forms, specific embodiments thereof have been shown by way of example in the drawings and are herein described in detail. It should be understood, however, that the description herein of specific embodiments is not intended to limit the invention to the particular forms disclosed, but on the contrary, the intention is to cover all modifications, equivalents, and alternatives falling within the spirit and scope of the invention as defined by the appended claims.

DETAILED DESCRIPTION OF THE INVENTION

Illustrative embodiments of the invention are described below. In the interest of clarity, not all features of an actual implementation are described in this specification. It will of course be appreciated that in the development of any such actual embodiment, numerous implementation-specific decisions must be made to achieve the developers' specific goals, such as compliance with system-related and business-related constraints, which will vary from one implementation to another. Moreover, it will be appreciated that such a development effort might be complex and time-consuming, but would nevertheless be a routine undertaking for those of ordinary skill in the art having the benefit of this disclosure.

Figure 2:
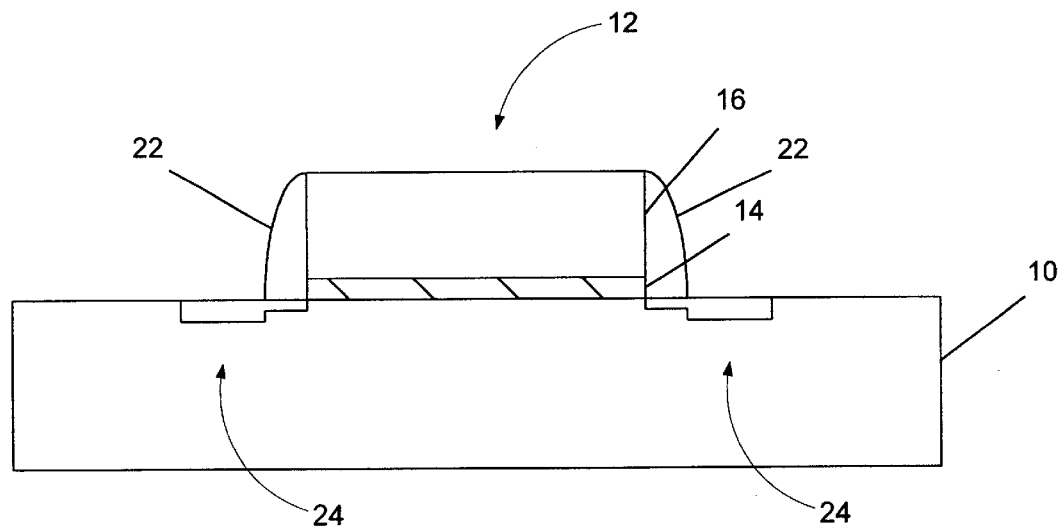
FIG. 2 is the device of FIG. 1 after it has been subjected to one or more anisotropic etching processes to form a plurality of silicon nitride spacers adjacent the gate stack of the semiconductor device.

The present invention is directed to a method of forming process layers comprised of silicon nitride. In disclosing the present invention, reference will be made to the illustrative transistor depicted in FIGS. 1–2. Although the various regions and structures are depicted in the drawings as having very precise, sharp configurations and profiles, those skilled in the art recognize that, in reality, those regions and structures are not as precise as indicated in the drawings. Additionally, the relative sizes of the various features depicted in the drawings may be exaggerated or reduced as compared to the size of those feature sizes on fabricated devices. Nevertheless, the attached drawings are included to aid in obtaining an understanding of the present invention.

As will also be apparent to those skilled in the art upon a complete reading of the present application, the present invention is not limited to any particular production tool used in the course of manufacturing such nitride layers, and the present process may be used with either single chamber tools or multiple chamber tools. For example, the present invention has been employed with a Novellus Concept 2 production tool. Moreover, the present method is applicable to a variety of technologies, e.g., NMOS, PMOS, CMOS, etc., and is readily applicable to a variety of devices, including, but not limited to, logic devices, memory devices, etc.

Figure 3:
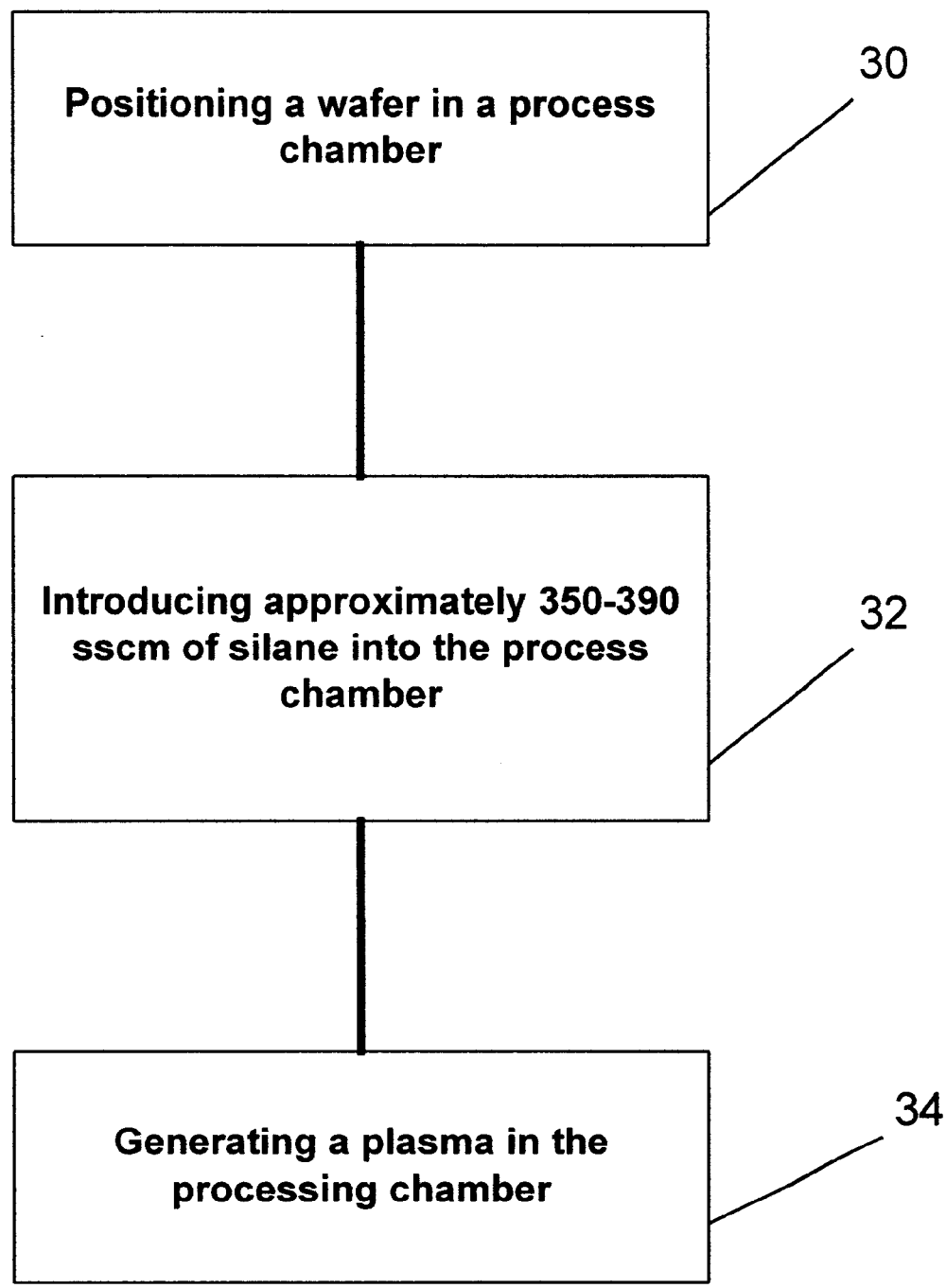
FIG. 3 is a flowchart depicting one illustrative embodiment of the present invention.

The present invention is directed to the formation of a silicon nitride layer using a plasma enhanced chemical vapor deposition ("PECVD") process with a relatively low flow rate of silane ($SiH_4$). As indicated in FIG. 3, one illustrative embodiment of the present invention comprises positioning a wafer into a process chamber, as indicated at block 30, introducing a low flow rate of silane ($SiH_4$) into the chamber, as indicated at block 32, and generating a plasma in the processing chamber, as indicated at block 34. In one illustrative example, the flow rate of the silane ranges from approximately 350–390 standard cubic centimeters (sccm) per minute, and in one particular example, approximately 370 sccm of silane. By using silane flow rates at this relatively low level, deposition rates on the order of approximately 800 Å per minute may be achieved, as compared to approximately 8000 Å per minute using prior art processes. By producing silicon nitride layers with this relatively low silane flow rate, better thickness control is also achieved, e.g., on the order of 1% variation as compared to the nominal thickness. Step coverage of nitride layers formed using the present process is also increased to approximately 80% as compared to step coverage of approximately 55% with prior art plasma enhanced techniques for forming such layers. Additionally, the density of the resulting nitride layer formed using the process disclosed herein is increased by approximately 20–25% when compared to nitride films formed using prior art techniques with higher flow rates of silane. Of course, the process of forming such silicon nitride layers is done in the presence of a carrier gas, such as, for example, nitrogen ($N_2$), and a source of nitride, such as ammonium ($NH_3$). The quantities of the carrier gas as well as the source of nitrogen to be used in forming the layer comprised of silicon nitride are all matters of design choice.

In one illustrative embodiment, the carrier gas for the silane used during the formation of the silicon nitride layer is comprised of approximately 2500–3100 sccm of nitrogen, and in one particular embodiment is comprised of approximately 2800 sccm of nitrogen. Of course, other carrier gases, such as helium (He), and argon (Ar), may be used in connection with the present invention, although the flow rate may be different than that described above for nitrogen.

Additionally, in one illustrative embodiment, the source of nitrogen used during the deposition process is comprised of approximately 2700–3300 sccm of ammonium ($NH_3$), and, in one particular embodiment, is comprised of approximately 3000 sccm of ammonium. Of course, gases other than ammonium, such as nitrous oxide ($N_2O$), may be used as a source of nitrogen in the process of forming the silicon nitride layers disclosed herein. However, the flow rate of such gases may be different than that disclosed above for ammonium.

Other process parameters, of course, must be considered in the formation of silicon nitride layers. One such parameter is the power used to generate the plasma in a plasma enhanced chemical vapor deposition ("PECVD") process. In one illustrative embodiment, the high frequency RF (HFRF) power used to generate the plasma ranges from approximately 325–365 watts, and in one particular example the HFRF power is approximately 345 watts. The low frequency RF (LFRF) power used to generate the plasma may range from approximately 125–165 watts, and in one particular example may be approximately 145 watts. Application of the power used to generate the plasma may also be delayed until a certain time after the silane has been introduced into the process chamber, e.g., a 1–2 second delay. The pressure employed during the present process may also range from approximately 1.7–2.1 torr, and in one particular embodiment is approximately 1.9 torr. Similarly, the temperature at which the process disclosed herein may be performed ranges from approximately 385–415° C., and in one particular embodiment is approximately 400° C.

In one particular embodiment, the present invention is comprised of forming a silicon nitride layer using the following recipe: silane ($SiH_4$): 350–390 sccm; nitrogen ($N_2$): 2500–3100 sccm; ammonium ($NH_3$): 2700–3300 sccm with a high frequency RF power (HFRF) setting ranging from approximately 325–365 watts, a low frequency RF power (LFRF) setting ranging from approximately 125–165 watts at a pressure ranging from approximately 1.7–2.1 torr, and at a temperature ranging from approximately 358–415° C. with a delay time for introducing the silane prior to the application of the power to form the plasma of approximately 1–2 seconds. The particular order of the introduction of the various process components into the process chamber may be varied as a matter of design choice.

Based on the foregoing, the silane flow rate described in the present invention may be expressed as a flow rate per unit area of the semiconducting substrate. For example, for a wafer having a nominal diameter of 8 inches (area equal to approximately 50.24 square inches), the silane flow rate per unit area may vary from approximately 6.97–7.76 standard cubic centimeters per minute of silane per square inch of substrate (sccm/in$^2$). In one particular embodiment, the flow rate of silane per unit area is approximately 7.36 sccm/in$^2$. In a similar manner, the flow rate of ammonium, for example, may vary between 53.74–65.68 sccm/in$^2$ of substrate, and, in one particular embodiment, may be approximately 59.71 sccm/in$^2$ of substrate. Similarly, the flow rate of nitrogen may vary between 49.76–61.68 sccm of nitrogen per square inch of substrate. In one embodiment, the flow rate of nitrogen may be approximately 55.73 sccm of nitrogen per square inch of substrate area. Moreover, the ratio of the high frequency RF power setting (HFRF) and the low frequency power setting (LFRF) to generate the plasma may vary between 2.6–2.2; the pressure may vary between 1.7–2.1 Torr, and the temperature may vary between approximately 358–415° C.

In one particular embodiment, the process recipe for forming a nitride layer may comprise using approximately 7.36 sccm of silane per square inch of substrate. In addition, the recipe may include approximately 55.73 sccm of nitrogen per square inch of substrate and/or approximately 59.71 sccm of ammonium per square inch of substrate. The plasma may be generated using a high frequency power setting (HFRF) to low frequency power setting (LFRF) ratio of approximately 2.4.

Using the present invention, silicon nitride films may be formed using a silane/ammonium flow rate ratio ranging from approximately 0.1296–0.1182; a silane/nitrogen flow rate ratio ranging from approximately 0.1400–0.1258; and at a high frequency RF power to low frequency RF power ratio ranging from approximately 2.6–2.2. In one particular embodiment of the present invention, silicon nitride layers may be made using a silane/ammonium flow rate ratio of approximately 0.1233; a silane/nitrogen flow rate ratio of approximately 0.1321; and at an HFRF/LFRF power ratio of approximately 2.4.

The particular embodiments disclosed above are illustrative only, as the invention may be modified and practiced in different but equivalent manners apparent to those skilled in the art having the benefit of the teachings herein. For example, the process steps set forth above may be performed in a different order. Furthermore, no limitations are intended to the details of construction or design herein shown, other than as described in the claims below. It is therefore evident that the particular embodiments disclosed above may be altered or modified and all such variations are considered within the scope and spirit of the invention. Accordingly, the protection sought herein is as set forth in the claims below.

What is claimed is:

1. A method of forming a process layer comprised of silicon nitride, comprising:

positioning a wafer in a process chamber;

introducing approximately 350–390 standard cubic centimeters per minute of silane (SiH$_4$) into said chamber; and generating a plasma in said chamber.

2. The method of claim 1, further comprising introducing ammonium (NH$_3$) or nitrous oxide (N$_2$O) into said chamber.

3. The method of claim 1, further comprising introducing approximately 2700–3300 standard cubic centimeters per minute of ammonium (NH$_3$) into said chamber.

4. The method of claim 1, further comprising introducing nitrogen (N$_2$) or helium (He) into said chamber.

5. The method of claim 1, further comprising introducing approximately 2500–3100 standard cubic centimeters per minute of nitrogen (N$_2$) into said chamber.

6. The method of claim 1, wherein generating a plasma in said chamber comprises generating a plasma in said chamber at a high frequency power ranging from approximately 325–365 watts and at a low frequency power ranging from approximately 125–165 watts.

7. The method of claim 1, further comprising raising the pressure in said chamber to a pressure ranging from approximately 1.7–2.1 Torr.

8. The method of claim 1, further comprising raising the temperature in said chamber to a temperature ranging from approximately 385–415° C.

9. The method of claim 1, wherein generating a plasma in said chamber is delayed until at least one second after the introduction of silane is started into the chamber.

10. The method of claim 1, wherein introducing approximately 350–390 standard cubic centimeters per minute of silane (SiH$_4$) into said chamber comprises introducing approximately 360–380 standard cubic centimeters per minute of silane (SiH$_4$) into said chamber.

11. The method of claim 1, wherein introducing approximately 350–390 standard cubic centimeters per minute of silane (SiH$_4$) into said chamber comprises introducing approximately 370 standard cubic centimeters per minute of silane (SiH$_4$) into said chamber.

12. A method of forming a process layer comprised of silicon nitride, comprising:

positioning a wafer in a processing chamber;

introducing approximately 350–390 standard cubic centimeters per minute of silane (SiH$_4$), and approximately 2700–3300 standard cubic centimeters per minute of ammonium (NH$_3$) into said chamber; and generating a plasma in said chamber.

13. The method of claim 12, further comprising introducing nitrogen (N$_2$) or helium (He) into said chamber.

14. The method of claim 12, further comprising introducing approximately 2500–3100 standard cubic centimeters per minute of nitrogen (N$_2$) into said chamber.

15. The method of claim 12, wherein generating a plasma in said chamber comprises generating a plasma in said chamber at a high frequency power ranging from approximately 325–365 watts and at a low frequency power ranging from approximately 125–165 watts.

16. The method of claim 12, further comprising raising the pressure in said chamber to a pressure ranging from approximately 1.7–2.1 Torr.

17. The method of claim 12, further comprising raising the temperature in said chamber to a temperature ranging from approximately 385–415° C.

18. The method of claim 12, wherein generating a plasma in said chamber is delayed until at least one second after the introduction of silane (SiH$_4$) is started into the chamber.

19. A method of forming a process layer comprised of silicon nitride, comprising:

positioning a wafer in a chamber of a production tool;

introducing approximately 350–390 standard cubic centimeters per minute of silane (SiH$_4$), approximately 2700–3300 standard cubic centimeters per minute of ammonium (NH$_3$), and approximately 2500–3100 standard cubic centimeters per minute of nitrogen (N$_2$) into said chamber; and generating a plasma in said chamber.

20. The method of claim 19, wherein generating a plasma in said chamber comprises generating a plasma in said chamber at a high frequency power ranging from approximately 325–365 watts and at a low frequency power ranging from approximately 125–165 watts.

21. The method of claim 19, further comprising raising the pressure in said chamber to a pressure ranging from approximately 1.7–2.1 Torr.

22. The method of claim 19, further comprising raising the temperature in said chamber to a temperature ranging from approximately 385–415° C.

23. The method of claim 19, wherein generating a plasma in said chamber is delayed until at least one second after the introduction of silane ($SiH_4$) is started into the chamber.

24. A method of forming a process layer comprised of silicon nitride, comprising:
positioning a wafer in a chamber of a production tool;
introducing approximately 350–390 standard cubic centimeters per minute of silane ($SiH_4$), approximately 2700–3300 standard cubic centimeters per minute of ammonium (NH3), and approximately 2500–3100 standard cubic centimeters per minute of nitrogen ($N_2$) into said chamber;
generating a plasma in said chamber at a high frequency power ranging from approximately 325–365 watts and at a low frequency power ranging from approximately 125–165 watts;
raising the pressure in said chamber to a pressure ranging from approximately 1.7–2.1 Torr; and
raising the temperature in said chamber to a temperature ranging from approximately 385–415° C.

25. The method of claim 24, wherein generating a plasma in said chamber is delayed until at least one second after the introduction of silane ($SiH_4$) is started into the chamber.

26. A method of forming a process layer comprised of silicon nitride, comprising:
positioning a semiconducting substrate in a process chamber, said substrate having a surface area;
introducing approximately 6.97–7.76 standard cubic centimeters per minute of silane ($SiH_4$) per square inch of surface area of said substrate into said chamber; and
generating a plasma in said chamber.

27. The method of claim 26, further comprising introducing ammonium ($NH_3$) or nitrous oxide ($N_2O$) into said chamber.

28. The method of claim 27, further comprising introducing approximately 53.74–65.68 standard cubic centimeters per minute of ammonium ($NH_3$) per square inch of surface area of said substrate into said chamber.

29. The method of claim 27, further comprising introducing nitrogen ($N_2$) or helium (He) into said chamber.

30. The method of claim 27, further comprising introducing approximately 49.76–61.68 standard cubic centimeters per minute of nitrogen ($N_2$) per square inch of surface area of said substrate into said chamber.

31. The method of claim 27, wherein generating a plasma in said chamber comprises generating a plasma in said chamber at a high frequency power ranging from approximately 325–365 watts and at a low frequency power ranging from approximately 125–165 watts.

32. The method of claim 27, further comprising raising, the pressure in said chamber to a pressure ranging from approximately 1.7–2.1 Torr.

33. The method of claim 27, further comprising raising the temperature in said chamber to a temperature ranging from approximately 385–415° C.

34. The method of claim 27, wherein generating a plasma in said chamber is delayed until at least one second after the introduction of silane is started into the chamber.

35. The method of claim 27, wherein introducing approximately 6.97–7.76 standard cubic centimeters per minute of silane ($SiH_4$) per square inch of surface area of said substrate into said chamber comprises introducing approximately 7.36 standard cubic centimeters per minute of silane ($SiH_4$) per square inch of surface area of said substrate into said chamber.

36. The method of claim 27, wherein generating a plasma comprises generating a plasma with a high frequency power to low frequency power ranging from approximately 2.6–2.2.

37. A method of forming a process layer comprised of silicon nitride, comprising:
positioning a semiconducting substrate in a processing chamber, said substrate having a surface area;
introducing approximately 6.47–7.76 standard cubic centimeters per minute of silane ($SiH_4$) per square inch of surface area of said substrate, and approximately 53.74–65.68 standard cubic centimeters per minute of ammonium ($NH_3$) per square inch of surface area of said substrate into said chamber; and
generating a plasma in said chamber.

38. The method of claim 37, further comprising introducing nitrogen ($N_2$) or helium (He) into said chamber.

39. The method of claim 37, further comprising introducing approximately 49.76–61.68 standard cubic centimeters per minute of nitrogen ($N_2$) per square inch of surface area of said substrate into said chamber.

40. The method of claim 37, wherein generating a plasma in said chamber comprises generating a plasma in said chamber at a high frequency power ranging from approximately 325–365 watts and at a low frequency power ranging from approximately 125–165 watts.

41. The method of claim 37, further comprising raising the pressure in said chamber to a pressure ranging from approximately 1.7–2.1 Torr.

42. The method of claim 37, further comprising raising the temperature in said chamber to a temperature ranging from approximately 385–415° C.

43. The method of claim 37, wherein generating a plasma in said chamber is delayed until at least one second after the introduction of silane ($SiH_4$) is started into the chamber.

44. A method of forming a process layer comprised of silicon nitride, comprising:
positioning a wafer in a chamber of a production tool;
introducing silane ($SiH_4$) and ammonium ($NH_3$) at a flow rate ratio ranging from approximately 0.1296–0.1182 silane to ammonium into said chamber; and
generating a plasma in said chamber.

45. The method of claim 44, further comprising introducing approximately 2500–3100 standard cubic centimeters per minute of hydrogen ($N_2$) into said chamber.

46. The method of claim 44, wherein generating a plasma in said chamber comprises generating a plasma in said chamber at a high frequency power ranging from approximately 325–365 watts and at a low frequency power ranging from approximately 125–165 watts.

47. The method of claim 44, further comprising raising the pressure in said chamber to a pressure ranging from approximately 1.7–2.1 Torr.

48. The method of claim 44, further comprising raising the temperature in said chamber to a temperature ranging from approximately 385–415° C.

49. The method of claim 44, wherein generating a plasma in said chamber is delayed until at least one second after the introduction of silane ($SiH_4$) is started into the chamber.

* * * * *